United States Patent
Yoo

(10) Patent No.: US 10,149,066 B2
(45) Date of Patent: Dec. 4, 2018

(54) MICROPHONE AND MANUFACTURING METHOD THEREOF

(71) Applicant: HYUNDAI MOTOR COMPANY, Seoul (KR)

(72) Inventor: Ilseon Yoo, Suwon-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 83 days.

(21) Appl. No.: 15/364,728

(22) Filed: Nov. 30, 2016

(65) Prior Publication Data

US 2018/0103324 A1    Apr. 12, 2018

(30) Foreign Application Priority Data

Oct. 6, 2016 (KR) .................... 10-2016-0129162

(51) Int. Cl.
| | |
|---|---|
| *H04R 25/00* | (2006.01) |
| *H04R 19/04* | (2006.01) |
| *B81B 3/00* | (2006.01) |
| *B81C 1/00* | (2006.01) |

(Continued)

(52) U.S. Cl.
CPC .......... *H04R 19/04* (2013.01); *B81B 3/0094* (2013.01); *B81C 1/00158* (2013.01); *H04R 1/342* (2013.01); *B81B 2201/0257* (2013.01); *B81C 2201/013* (2013.01); *H04R 31/003* (2013.01); *H04R 2201/003* (2013.01)

(58) Field of Classification Search
CPC .. H04R 19/04; H04R 1/342; H04R 2201/003; B81B 3/0094; B81B 2201/0257; B81C 1/00158; B81C 2201/013

USPC ......... 257/416–417; 381/176, 191, 357, 151, 381/356; 438/50
See application file for complete search history.

(56) References Cited

U.S. PATENT DOCUMENTS

| | | | |
|---|---|---|---|
| 5,804,083 A * | 9/1998 | Ishii | ......................... B41J 2/16 216/2 |
| 7,346,178 B2 * | 3/2008 | Zhe | ...................... H04R 31/003 381/174 |

(Continued)

FOREIGN PATENT DOCUMENTS

| | | |
|---|---|---|
| KR | 10-0571967 B1 | 4/2006 |
| KR | 10-2007-0031512 A | 3/2007 |
| KR | 10-2010-0032927 A | 3/2010 |

*Primary Examiner* — Phylesha Dabney
(74) *Attorney, Agent, or Firm* — Knobbe Martens Olson & Bear LLP

(57) ABSTRACT

Disclosed are a microphone and a manufacturing method thereof. The microphone includes a substrate with a through portion formed in a central portion thereof, a vibration membrane disposed on the substrate and covering the through portion, a fixed membrane installed above the vibration membrane and spaced apart from the vibration membrane with an air layer interposed therebetween, and including a plurality of air inlets perforated in a direction toward the air layer, a support layer supporting the fixed membrane installed above the vibration membrane and spaced apart from the vibration membrane, a back plate formed on the fixed membrane and the support layer and having the air inlet formed to extend in a central portion thereof, and an air outflow part allowing air of the air layer to flow to an outer area of an edge of a sensing area of the fixed membrane on the back plate.

17 Claims, 12 Drawing Sheets

(51) Int. Cl.
*H04R 1/34* (2006.01)
*H04R 31/00* (2006.01)

(56) References Cited

U.S. PATENT DOCUMENTS

| | | | | |
|---|---|---|---|---|
| 7,933,428 B2* | 4/2011 | Sawada | ................ | H04R 1/406 |
| | | | | 257/416 |
| 8,012,785 B2* | 9/2011 | Liang | ................ | B81C 1/00246 |
| | | | | 257/414 |
| 8,045,734 B2* | 10/2011 | Zhe | ................ | H04R 31/003 |
| | | | | 381/174 |
| 8,174,085 B2* | 5/2012 | Nakatani | ............... | G01L 9/0042 |
| | | | | 257/417 |
| 8,731,220 B2 | 5/2014 | Zhang et al. | | |
| 9,382,109 B2* | 7/2016 | Johansen | ............... | H04R 1/222 |
| 9,403,670 B2* | 8/2016 | Schelling | ............. | B81B 3/0059 |
| 9,668,056 B2* | 5/2017 | Dehe | ................ | H04R 31/00 |
| 9,723,423 B2* | 8/2017 | Uchida | ................ | H04R 31/00 |
| 2006/0093170 A1* | 5/2006 | Zhe | ................ | H04R 31/003 |
| | | | | 381/191 |
| 2008/0123878 A1* | 5/2008 | Zhe | ................ | H04R 31/003 |
| | | | | 381/191 |
| 2010/0052082 A1* | 3/2010 | Lee | ................ | B81B 7/0061 |
| | | | | 257/416 |
| 2010/0065930 A1* | 3/2010 | Nakatani | ............. | B81C 1/00476 |
| | | | | 257/415 |
| 2010/0273286 A1* | 10/2010 | Liang | ................ | B81C 1/00246 |
| | | | | 438/50 |
| 2011/0280419 A1* | 11/2011 | Kasai | ................ | H04R 1/06 |
| | | | | 381/176 |
| 2011/0316100 A1* | 12/2011 | Kim | ................ | B81C 1/00158 |
| | | | | 257/416 |
| 2017/0311088 A1* | 10/2017 | Sun | ................ | H04R 19/04 |
| 2017/0339494 A1* | 11/2017 | Perletti | ............... | B81C 1/00158 |

\* cited by examiner

Edge of sensing area of fixed membrane
(sensing area)

Outside of edge of sensing area of fixed membrane
(non-sensing area)

<Related art structure>

<Structure with air outflow part of present invention>

MICROPHONE AND MANUFACTURING METHOD THEREOF

CROSS-REFERENCE TO RELATED APPLICATION

This application claims priority to and the benefit of Korean Patent Application No. 10-2016-0129162 filed in the Korean Intellectual Property Office on Oct. 6, 2016, the entire contents of which are incorporated herein by reference.

BACKGROUND (a) Field

The present disclosure relates to a microphone and a manufacturing method thereof and, more particularly, to a highly sensitive micro-electromechanical system (MEMS) microphone in consideration of directional characteristics at a single device level.

(b) Description of the Related Art

In general, a MEMS microphone, a device converting an audio signal into an electrical signal, is manufactured using a semiconductor batch process.

Compared with an electrets condenser microphone (ECM) applied to most vehicles, the MEMS microphone advantageously has excellent sensitivity and low performance variations of products, is microminiaturized, and strong to a change in an environment such as heat, humidity, and the like. Thus, recently, development has been made toward replacement of ECMs with MEMS microphones.

The disclosure of this section is to provide background of the invention. Applicant notes that this section may contain information available before this application. However, by providing this section, Applicant does not admit that any information contained in this section constitutes prior art.

SUMMARY

The present disclosure has been made in an effort to provide a microphone having advantages of enhancing directional characteristics in a single device level by forming an air flow part capable of maintaining a sensing area, while reducing an air damping effect between a vibration membrane and a fixed membrane, and a manufacturing method thereof.

One aspect of the present invention provides a microphone including: a substrate with a through portion formed in a central portion thereof; a vibration membrane disposed on the substrate and covering the through portion; a fixed membrane installed above the vibration membrane and spaced apart from the vibration membrane with an air layer interposed therebetween, and including a plurality of air inlets perforated in a direction toward the air layer; a support layer supporting the fixed membrane installed above the vibration membrane and spaced apart from the vibration membrane; a back plate formed on the fixed membrane and the support layer and having the air inlet formed to extend in a central portion thereof; and an air outflow part allowing air of the air layer to flow to an outer area of an edge of a sensing area of the fixed membrane on the back plate.

The air outflow part may include: a plurality of slots vertically penetrating through the outer area of the edge of sensing area of the fixed membrane of the back plate with respect to the fixed membrane; and a connection passage connecting the plurality of slots and the air layer.

The plurality of slots may be disposed in a circular shape along the outer area of the edge of the sensing area of the fixed membrane, centered on the fixed membrane.

The plurality of slots may be disposed in a circular shape along the outer area of the edge of the sensing area of the fixed membrane, centered on the fixed membrane.

The connection passage may be formed by forming a photoresist layer (PR) on portions of upper surfaces of the vibration membrane and the oxide film, forming the plurality of slots on the PR layer, and subsequently removing the PR layer.

The microphone may further include: a directional package in which a first sound source inflow hole is formed below a substrate where the through portion is formed and a second sound source inflow hole is formed above the substrate and a sound source is introduced through the first sound source inflow hoe and the second source inflow hole.

The vibration membrane may include a vibration electrode exposed by the through hole and vibrated by a sound source, a conducting wire connected to the vibration electrode, and a pad electrically connected to a semiconductor chip when mounted in a directional package.

The vibration electrode, the conducing wire, and the pad of the vibration membrane may be formed at a time by patterning a conductive material.

An oxide film may be disposed between the substrate and the vibration membrane and a central portion of the oxide film is open to allow the through portion to extend inwardly.

Another aspect of the present invention provides a method for manufacturing a microphone, including: a) forming an oxide film and a vibration membrane on a substrate and forming a photoresist (PR) layer on portions of upper surfaces of the vibration membrane and the oxide film; b) forming a sacrificial layer on the oxide film with the vibration membrane and the PR layer formed thereon and forming a fixed membrane and a back plate on the sacrificial layer; c) etching the back plate and the underlying fixed membrane in the same pattern to form a plurality of air inlets and forming a plurality of slots vertically penetrating a non-sensing area outside of an edge of a sensing area of the fixed membrane; d) removing a central portion of the sacrificial layer through the plurality of air inlets to form an air layer and removing a portion of the sacrificial layer through the plurality of slots to expose the PR layer; e) removing the PR layer through the plurality of slots to form an air outflow part allowing air of the air layer to flow out from the edge of the sensing area of the fixed membrane through the plurality of slots; and f) forming a through portion allowing a sound source input by etching a rear side of the central portion of the substrate.

Operation e) may include: removing the PR layer to form a connection passage connecting the plurality of slots and the air layer.

In operation d), a central portion of the sacrificial layer may be removed to form a support layer supporting an edge portion of the fixed membrane.

Operation c) may include: forming a first contact hole opening a first pad of the fixed membrane and a second contact hole opening a second pad of the vibration membrane on the back plate.

Operation d) may include: removing a portion of the sacrificial layer through the first contact hole and the second contact hole to expose the first pad and the second pad.

In operation c), the plurality of air inlets, the plurality of slots, and the first and second contact holes may be simultaneously formed through the same etching process.

In operation d), the sacrificial layer of the portions where the plurality of slots and the first and second contact holes extend may be simultaneously removed through a wet or dry etching method.

Yet another embodiment of the present invention provides a method for manufacturing a microphone, including: a) forming an oxide film and a vibration membrane on a substrate and forming a photoresist (PR) layer on portions of upper surfaces of the vibration membrane and the oxide film; b) forming a sacrificial layer on the oxide film with the vibration membrane and the PR layer formed thereon and forming a fixed membrane and a back plate on the sacrificial layer; c) etching the back plate and the underlying fixed membrane in the same pattern to form a plurality of air inlets and forming a plurality of slots vertically penetrating a non-sensing area outside of an edge of a sensing area of the fixed membrane; d) removing a central portion of the sacrificial layer through the plurality of air inlets to form an air layer and removing a portion of the sacrificial layer through the plurality of slots to expose the PR layer; e) forming a first through portion for a sound source input to a central portion and a second through portion opening the PR layer by etching a rear side of the substrate; and f) removing the PR layer through the second through portion to form an air outflow part allowing air of the air layer to flow out from the edge of the sensing area of the fixed membrane through the plurality of slots.

The method may further include: after operation f), g) mounting in a directional package in which a first sound source inflow hole is formed in a lower main board and a second sound source inflow hole is formed in an upper case to allow a sound source to be introduced, wherein the first through portion is positioned above the first sound source inflow hole and the second through portion is blocked by the main board.

According to an embodiment of the present invention, since the thin, long slots reducing an air damping effect between the vibration membrane and the fixed membrane are formed on the outer area of the edge of the sensing area of the fixed membrane to allow air of the air layer to flow out, whereby sensitivity may be increased by reducing the air damping effect without reducing the sensing area.

Also, application of the microphone to a directional microphone package allows air flow but prevents an introduction of a sound source through the thin, long holes of the slots, whereby sensitivity, together with directional characteristics, may be increased.

DETAILED DESCRIPTION OF EMBODIMENTS

Figure 1:
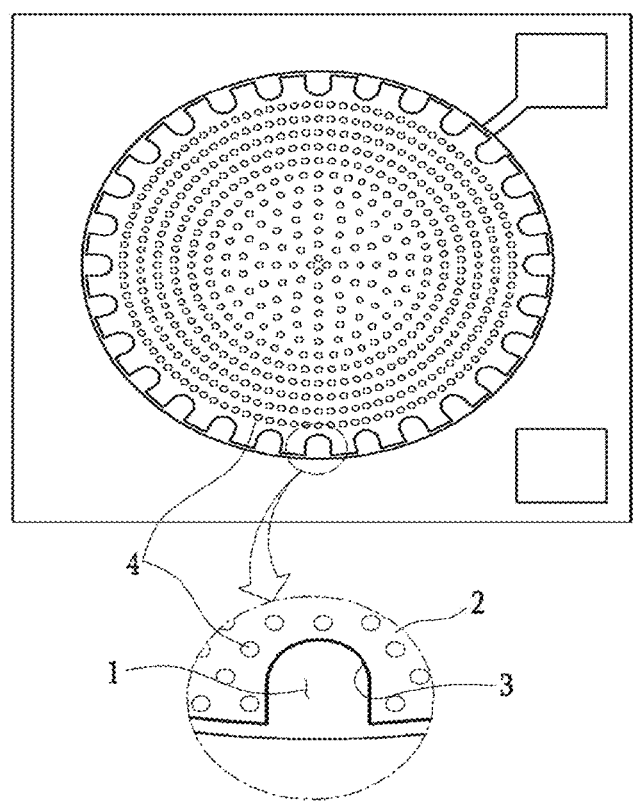
FIG. 1 is a plan view of a micro-electromechanical system (MEMS) microphone for reducing an air damping effect.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising", will be understood to imply the inclusion of stated elements but not the exclusion of any other elements. In addition, the terms "-er", "-or" and "module" described in the specification mean units for processing at least one function and operation and can be implemented by hardware components or software components and combinations thereof. Throughout the specification, a sound source input to a microphone has the same meaning as that of a sound or a sound pressure vibrating a vibration membrane.

Hereinafter, a microphone and a manufacturing method thereof according to an embodiment of the present invention will be described in detail with reference to the accompanying drawings.

In order to increase sensitivity, one of the most important performance indices of MEMS microphones, research into a reduction in rigidity or maximization of a sensing area has been conducted, but there is a limitation in increasing sensitivity due to an influence of air damping. Here, air damping refers to suppression of vibration displacement as vibrations of a vibration membrane are absorbed by air and pressure thereof. Also, degradation in sensitivity due to suppression of vibration displacement is called an air damping effect.

Referring to FIG. 1, a MEMS microphone has large holes 3 formed at the edges of a fixed membrane 2 in order to reduce a damping effect due to air, one of the factors suppressing vibration displacement of a vibration membrane 1. Also, existing holes 4, allowing for air inflow, are formed in the fixed membrane 2.

Although the MEMS microphone has the large holes 3 formed at the edges of the fixed membrane 2 to reduce an air damping effect, since a sensing area is reduced by the area of the large holes 3, a scheme of optimizing fixed membrane hole formation variables (e.g., a size, a position, and the like) in a trade-off relation is required.

Also, a vehicle environment requires a microphone having directionality, as well as sensitivity, due to noise scattered around, but the MEMS microphone is not able to implement directional characteristics due to the large holes 3 formed at the edges of the fixed membrane 2. Thus, a structure having a novel concept capable of solving the problem of the trade-off relation and the problem of directional characteristics of the MEMS microphone is urgently required.

Figure 2:
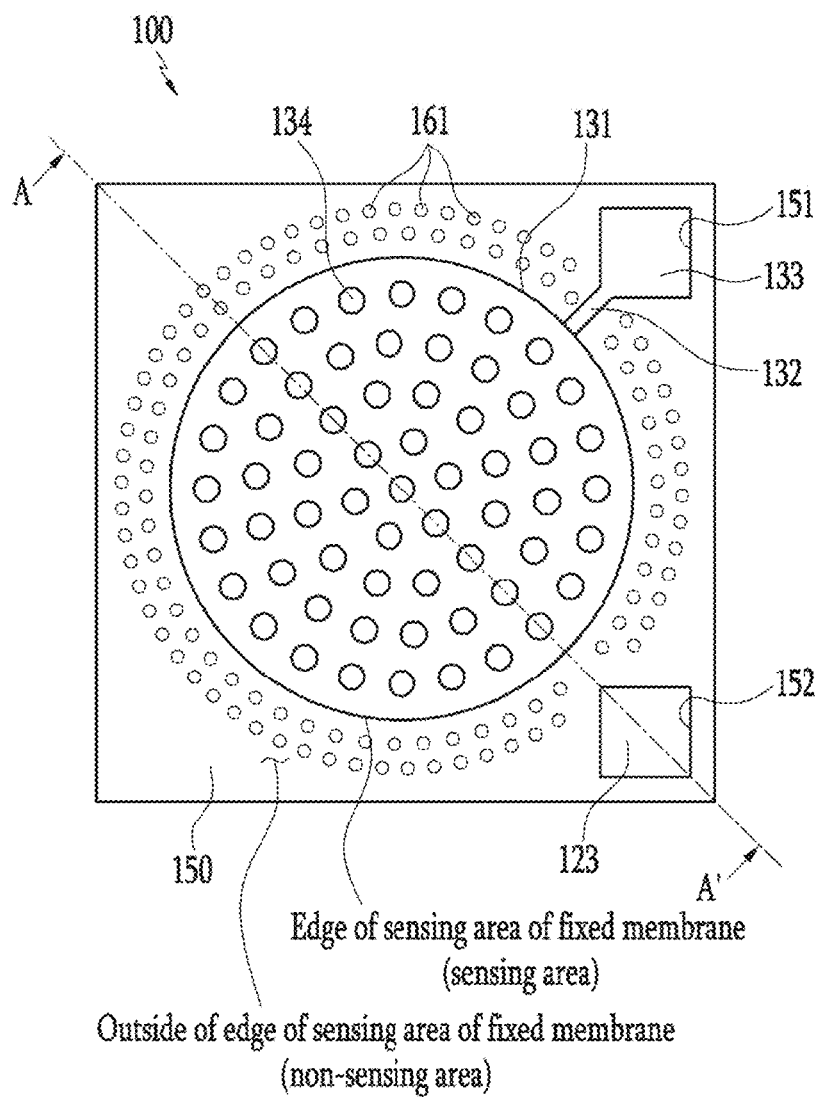
FIG. 2 is a view schematically illustrating a planar structure of a microphone according to an embodiment of the present invention.

FIG. 2 is a view schematically illustrating a planar structure of a microphone according to an embodiment of the present invention.

Figure 3:
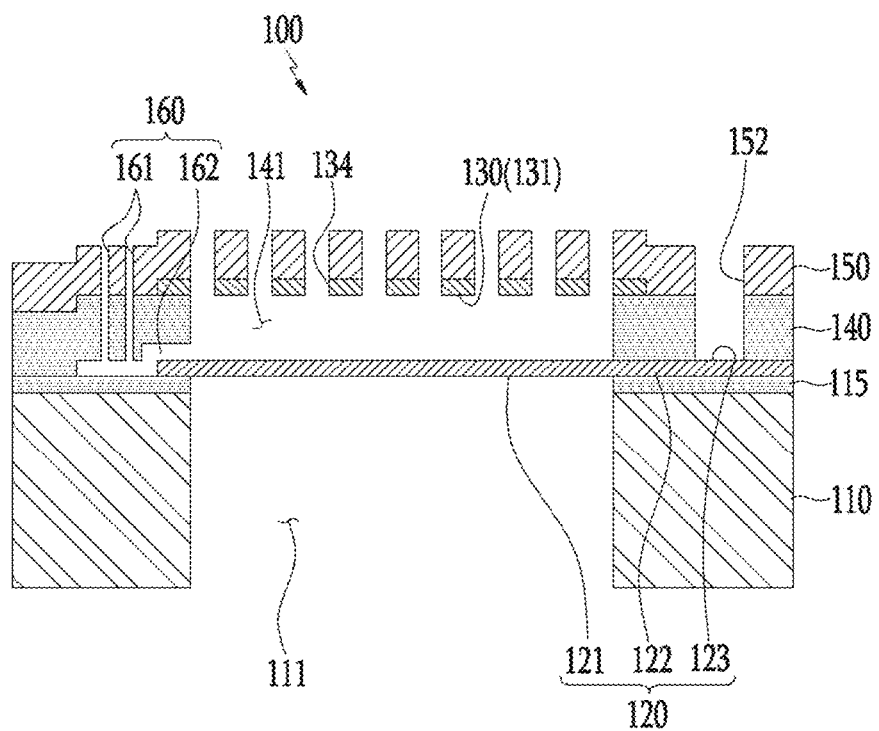
FIG. 3 is a cross-sectional view of a microphone according to an embodiment of the present invention, taken along line A-A'.

FIG. 3 is a cross-sectional view of a microphone according to an embodiment of the present invention, taken along line A-A'.

Referring to FIGS. 2 and 3, a microphone 100 according to an embodiment of the present invention includes a substrate or base 110, a vibration membrane 120, a fixed membrane 130, a support layer 140, a back plate 150, and an air outflow part 160.

The substrate 110 may be formed of silicon and a through portion 111 is formed in a central portion thereof to allow a sound source (sound pressure) to be input thereto. The vibration membrane 120 is disposed on the substrate 110 and covering the through portion. Thus, the vibration membrane 120 is partially exposed by the through portion 111 formed in the substrate 110, and the exposed portion is vibrated by a sound source transferred from the outside. Here, an oxide film 115 is disposed between the substrate 110 and the vibration membrane 120, and a central portion thereof is open (etched) to allow the through portion 111 to extend inwardly.

The vibration membrane 120 may be formed of polysilicon or a silicon nitride, but, without being limited thereto, any material may be applied as long as it has conductivity. The vibration membrane 120 includes a vibration electrode 121 part exposed by the through hole and vibrated by a sound source, a conducting wire 122 part connected to the vibration electrode 121 part, and a second pad 123 part electrically connected to a semiconductor chip when the microphone 100 is mounted in a directional package 200 (to be described hereinafter). The vibration electrode 121, the conducing wire 122, and the second pad 123 may be formed at a time by patterning a conductive material.

The fixed membrane 130 is installed above the vibration membrane 120 and spaced apart from the vibration membrane 120 with an air layer 141 interposed therebetween, and includes a plurality of air inlets 134. The fixed membrane 130 may be formed of polysilicon or a silicon nitride (SiNx), but, without being limited thereto, any material may be applied as long as it has conductivity. Like the vibration membrane 120, the fixed membrane 130 may include a fixed electrode 131 sensing vibration displacement of the vibration membrane 120, a conducting wire 132, and a first pad 133 (please refer to FIG. 2). Here, the fixed electrode 131 corresponds to a substantial sensing area of the fixed membrane 130 facing the vibration electrode 121. Edge portions of the fixed membrane 130 are fixedly supported by the support layer 140 formed of an oxide.

The support layer 140 supports the fixed membrane 130 on the vibration membrane and the oxide film 115, and a central portion is opened (etched) to form an air layer 141. Here, the support layer 140 is formed as a central portion of a sacrificial layer 140' is etched in a method for manufacturing the microphone 100 as described hereinafter.

The back plate 150 is formed on the fixed membrane and the support layer 140, and an air inlet 134 having the same pattern as that of the fixed membrane 130 is formed to extend in a central portion of the back plate 150. The back plate 150 may be formed by depositing silicon nitride (SiN). The back plate 150 includes a first contact hole 151 opening the first pad 133 of the fixed membrane 130 and a second contact hole 152 opening the second pad 123 of the vibration membrane 120.

The entire area of the microphone 100 may be divided into an inner sensing area and an outer non-sensing area with respect to an edge of the sensing area of the fixed membrane 130. Here, the edge of the sensing area refers to a circle in which the fixed electrode 131 is substantially formed.

The microphone 100 includes an air outflow part 160 connected to the non-sensing area outside the edge of the sensing area of the fixed membrane 130 on the back plate 150 in order to allow air of the air layer 14 to flow outwardly. The air outflow part 160 includes a plurality of thin, long holes (referred to as "slots" hereinafter) 161 vertically penetrating through the non-sensing area of the back plate 150 with respect to the fixed membrane 130 and a connection passage 162 connecting the plurality of slots 161 and the air layer 141. The slots 161 are disposed in a circular shape along the outer area of the edge of the sensing area of the fixed membrane based on the fixed membrane 130 as a central axis. The air outflow part 160 serves to reduce an influence of air damping when the vibration membrane 120 is vibrated by an external sound source to enhance sensitivity of the microphone 100.

In the MEMS microphone of the illustrated embodiments, a sound receiving hole (through portion) 111 is formed through the base (substrate) 110. The vibration membrane 120 is formed over the base 110, covering the sound receiving hole 111. The support layer 140 is formed over the base 110, defining an empty space 141 corresponding to the sound receiving hole 111. The vibration membrane 120 is inserted between the sound receiving hole 111 and the space defined by the support layer 140. The back plate 150 is formed over the support layer 140, covering the empty space 141. The fixed membrane 130 is formed on the back plate 150, facing the vibration membrane 120 with the empty space (gap) 141.

In embodiments, the inner of the base 110 and the support layer 140 are generally aligned such that the sound receiving hole 111 and the empty space 141 are about the same size. In embodiments, the periphery of the vibration membrane 120 extends to the top of the base 110 beyond the sound receiving hole 111 when viewing in a direction perpendicular to the vibration membrane 120.

Each of the vibration membrane 120 and fixed membrane 130 is made of an electrically conductive material such that the two opposing membranes form an electrical capacitor. As sound wave enters the sound receiving hole 111, the vibration membrane 120 vibrates or trembles, causing the capacitance between the two membranes to vary, which overall converts the sound wave to electrical signals. Perforations (air inlets) 134 are formed through the back plate 150 and the fixed membrane 130 to allow air to move into the gap 141 from above the back plate 150 and also to all air to move out of the gap to above the back plate 150.

In embodiments, the MEMS microphone include at least one air exhaust that connects the gap 141 to outside such that some air in the gap 141 to move out therethrough in addition to moving out through the perforations 134. Each air exhaust includes an air discharge opening 161 and an air channel connecting the air discharge opening 161 to the empty space or gap 141. In embodiments, the air channel includes a vertical portion that extends generally perpendicular to the vibration membrane 120. In embodiments, the air channel also includes a horizontal portion that extends generally perpendicular to the vertical portion.

In embodiments, the at least one air exhaust is formed through a portion of the back plate 150 in which the fixed membrane 130 is not formed or to which the electrically conductive layer of the fixed membrane 130 does not extend. In embodiments, the at least one air exhaust is formed through a portion of the back plate 150 which is outside the vibration membrane 120 when viewing in a direction perpendicular to the vibration membrane 120. In embodiments, the at least one air exhaust formed through a portion of the back plate 150 which is outside the sound receiving hole 111 when viewing in a direction perpendicular to the vibration membrane 120. In embodiments, the vertical portion of air channel is formed through a portion of the support layer 140 that is outside the sound receiving hole 111 when viewing in a direction perpendicular to the vibration membrane 120.

Figure 4:
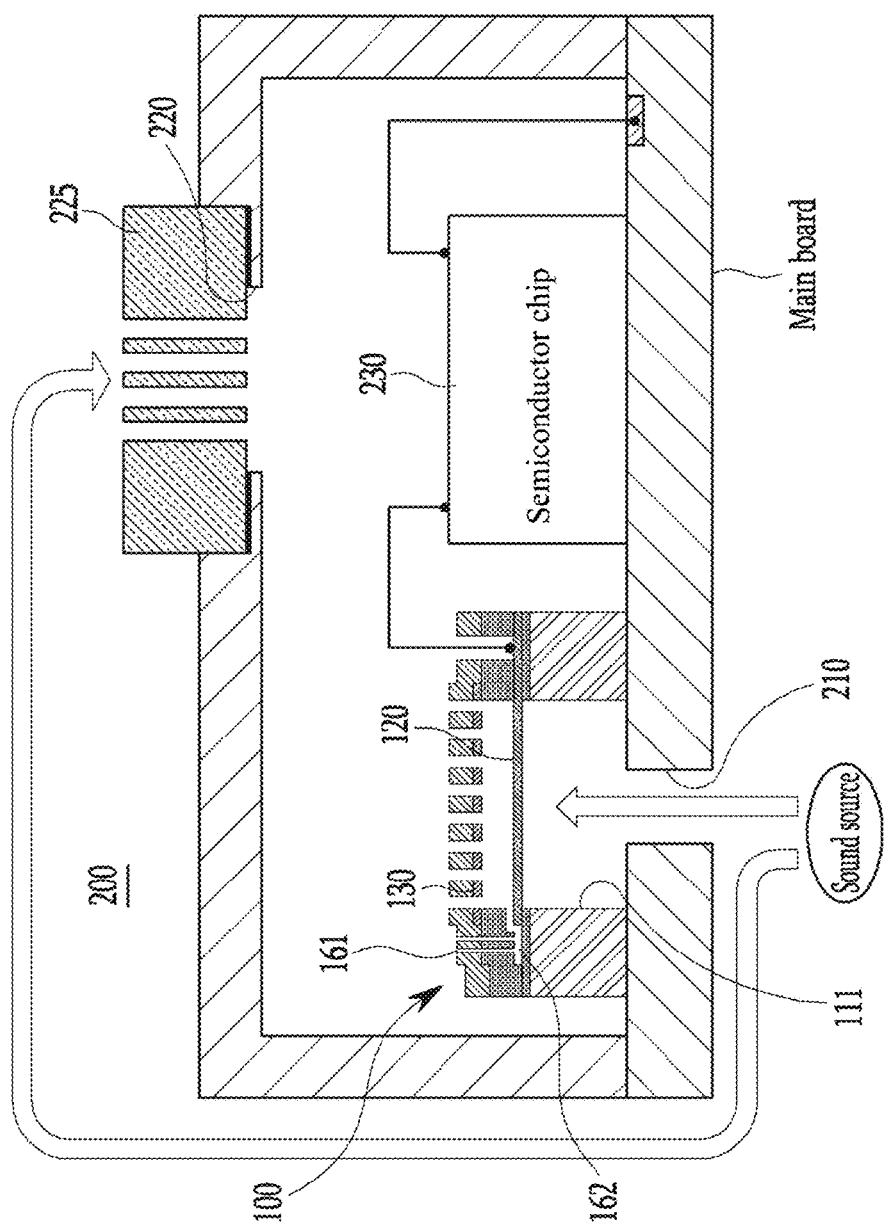
FIG. 4 is a view schematically illustrating a directional package structure of a microphone according to an embodiment of the present invention.

FIG. 4 is a view schematically illustrating a directional package structure of a microphone according to an embodiment of the present invention.

Referring to FIG. 4, in a directional package 200 according to an embodiment of the present invention, a first sound source inflow hole 210 is formed in a lower portion where the microphone 100 is installed and a second sound source inflow hole 220 where a sound delay filter 225 is configured is formed in an upper portion, through which a sound source may be introduced.

The sound delay filter 225 may be configured as a porous silicon filter.

Here, single directionality is implemented when a sound source reaches the vibration membrane 120 of the MEMS microphone 100 with a time difference through the sound source inflow holes 210 and 220 respectively provided in the lower portion and the upper portion of the directional package 200 due to the presence of the sound delay filter 225.

The microphone 100 is installed on a main board such that the through portion 111 is positioned at a central axis of the first sound source inflow hole 210.

Also, when the sound source is introduced to the upper and lower portions of the directional package 200, a signal sensed by the microphone 100 is processed through a semiconductor chip 230.

When the sound source introduced through the upper portion of the directional package 200 reaches the vibration membrane 120, if the sound source flows to the slot 161 formed outside the edge of the fixed membrane 130, directional characteristics may be affected.

Thus, in order to prevent this, the slot 161 formed in the non-sensing region of the microphone 100 is configured to have a thin, long hole size allowing only a flow of air and preventing an introduction of a sound source.

For example, as illustrated in FIG. 3, the slot 161 may be configured to be thin and long, relative to at least the air inlet 134 to minimize an introduction of a sound source.

Also, the difference between the hole sizes of the slot 161 and the air inlet 134 causes a difference in air pressure when air is introduced from the upper portion of the directional package 200, and thus, air formed in the air layer 141 flows to the slot 161.

In other words, the difference in air pressure due to the difference between the sizes of the two holes may further prevent an introduction of a sound source, as well as substantial air inflow to the slot 161.

The connection passage 162 is a passage connecting the slot 161 and the air layer 141.

The connection passage 162 may be formed by forming a photoresist layer (PR) 162' on portions of upper surfaces of the vibration membrane 120 and the oxide film 115, forming the slot 161 on the PR layer 162', and subsequently removing the PR layer 162'.

In this manner, in the microphone 100 according to an embodiment of the present invention, the slot 161 reducing an air damping effect between the vibration membrane 120 and the fixed membrane 130 is formed on the outside of the edge of the sensing area of the fixed membrane 130. Accordingly, in the microphone 100 according to an embodiment of the present invention, sensitivity may be increased by resultantly reducing air damping, without primarily reducing the sensing area. That is, the microphone 100 according to an embodiment of the present invention has the optimized structure solving the problem arising due to the formation of holes in the fixed membrane in a trade-off relation discussed above in the description of the background of the present invention.

Also, the slot 161 applied to the microphone 100 allows air inflow but prevents an introduction of a sound source. Thus, when the microphone 100 is applied to a directional microphone package, sensitivity may be increased, while the directional characteristics are maintained.

Figure 5:
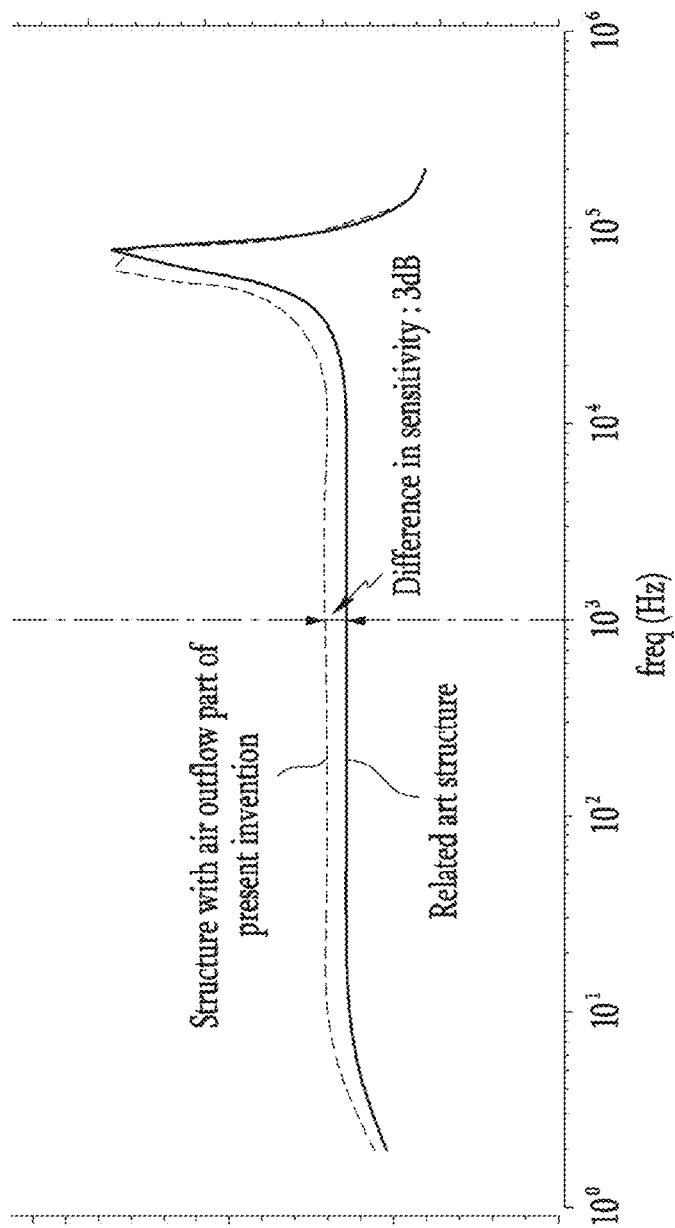
FIGS. 5 and 6 are views illustrating results of comparing and verifying sensitivity and directional patterns between a directional package having a microphone structure with an air outflow part according to an embodiment of the present invention and a related art structure.
Figure 6:
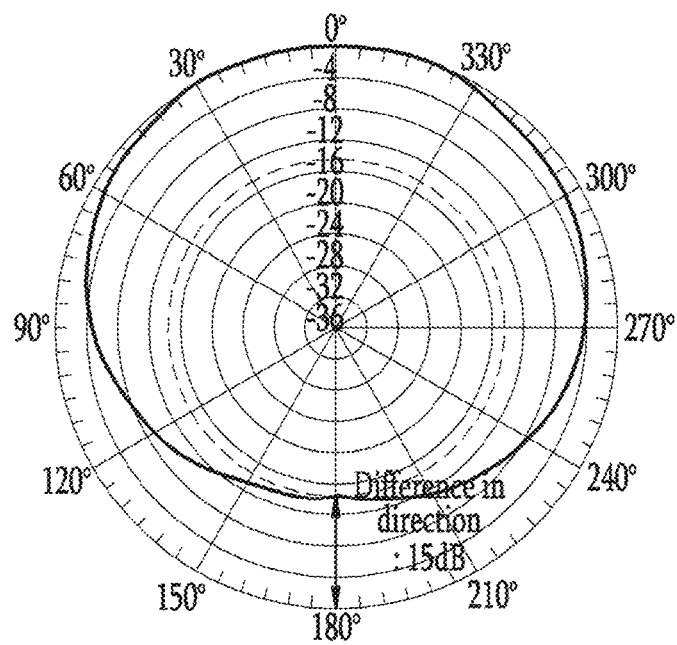
Figure 6:
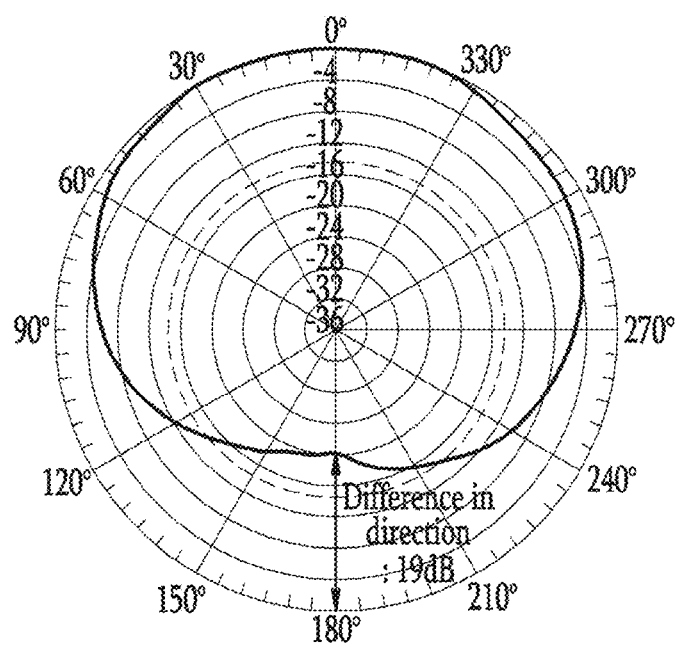

FIGS. 5 and 6 are views illustrating results of comparing and verifying sensitivity and directional patterns between a directional package having a microphone structure with an air outflow part according to an embodiment of the present invention and a related art structure.

Referring to FIG. 5, it can be seen that the structure of the microphone 100 in which the plurality of slots 161 are formed outside of the edge of the sensing area of the fixed membrane 130 according to an embodiment of the present invention has enhanced sensitivity about 3 dB higher than that of the directional microphone structure illustrated In FIG. 1.

Also, referring to FIG. 6, in the case of directional characteristics, it can be seen that the structure of the microphone 100 in which the plurality of slots 161 are formed outside of the edge of the sensing area of the fixed membrane 130 according to an embodiment of the present invention has directional characteristics about 4 dB greater than those of the directional microphone structure of FIG. 1.

Through the results, it can be verified that the plurality of slots 161 formed outside of the edge of the sensing area of the fixed membrane 130 according to an embodiment of the present invention contribute to enhancement of sensitivity and a difference in direction (directional characteristics), compared with the microphone of FIG. 1.

A method for manufacturing the microphone 100 according to an embodiment of the present invention will be described with reference to FIGS. 7 to 13.

FIGS. 7 to 13 are views illustrating a method for manufacturing a microphone according to an embodiment of the present invention.

Figure 7:
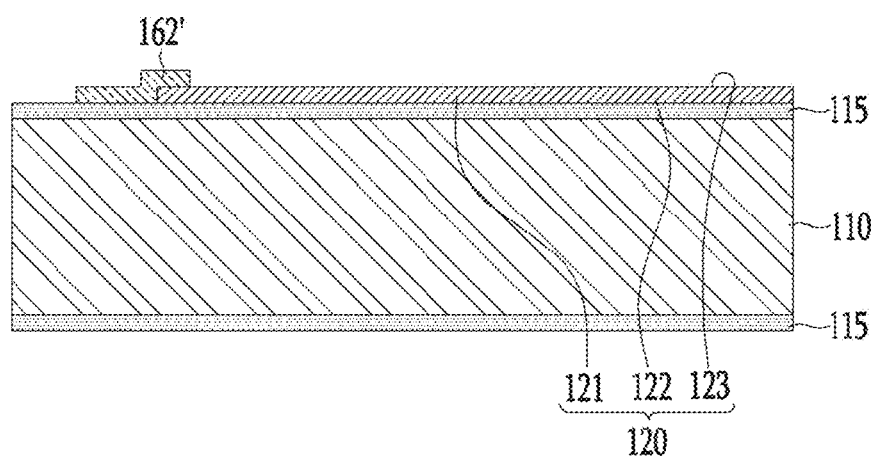
FIGS. 7 to 13 are views illustrating a method for manufacturing a microphone according to an embodiment of the present invention.

Referring to FIG. 7, after a substrate 110 is prepared, oxide films 115 are formed on upper surface and lower surface of the substrate 110. Here, the substrate 110 may be formed of silicon, and the oxide films 115 may be formed by depositing a silicon oxide.

Thereafter, a vibration membrane 120 is formed on oxide film 115, and a PR layer 162' is formed on portions of upper surfaces of the vibration membrane 120 and the oxide film 115.

Here, the vibration membrane 120 includes a vibration electrode 121, a conducting wire 122, and a second pad 123 distinguished according to purposes, and these parts may be formed at a time by patterning a single conductive material.

Figure 8:
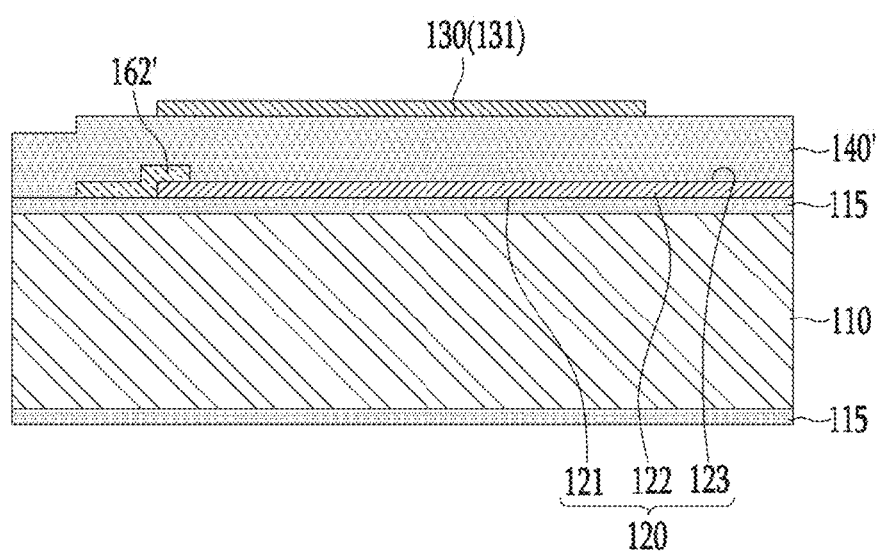

Referring to FIG. 8, a sacrificial layer 140' is formed on the oxide film 115 with the vibration membrane 120 and the PR layer 162' formed thereon, and a fixed membrane 130 is formed on the sacrificial layer 140'.

The sacrificial layer 140' may be formed using any one of a photosensitive material, a silicon oxide, and a silicon nitride. The photosensitive material has thermally, mechanically stable structure and easily removed in terms of process.

Like the vibration membrane 120, the fixed membrane 130 includes a fixed electrode 131, a conducting wire 132, and a first pad 133, and these parts may be formed at a time by patterning a conductive material.

In the following cross-sectional views, only the fixed electrode 131 part (sensing area) based on a cross-section position is illustrated.

Figure 9:
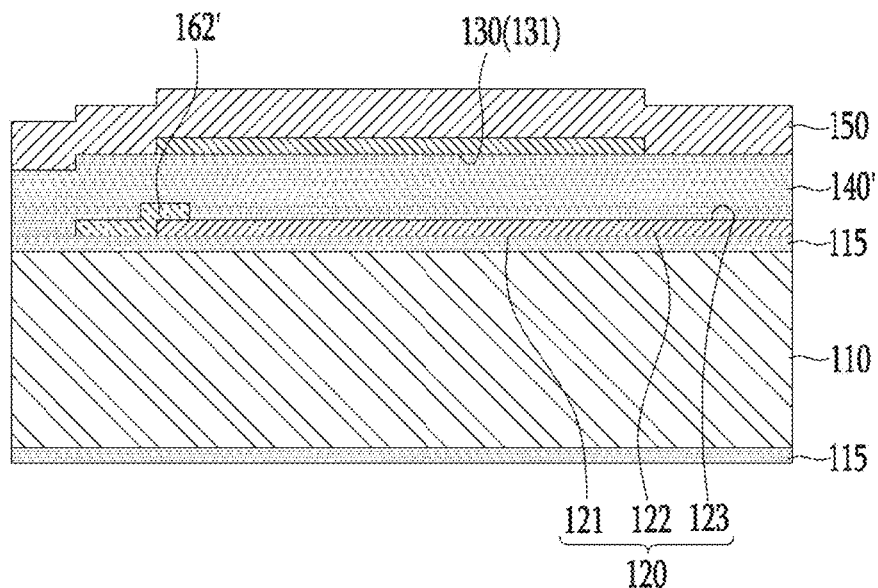

Referring to FIG. 9, a back plate 150 is formed on the fixed membrane 130 and the sacrificial layer 140'.

The back plate 150 may be formed by depositing a silicon nitride (SiN).

Figure 10:
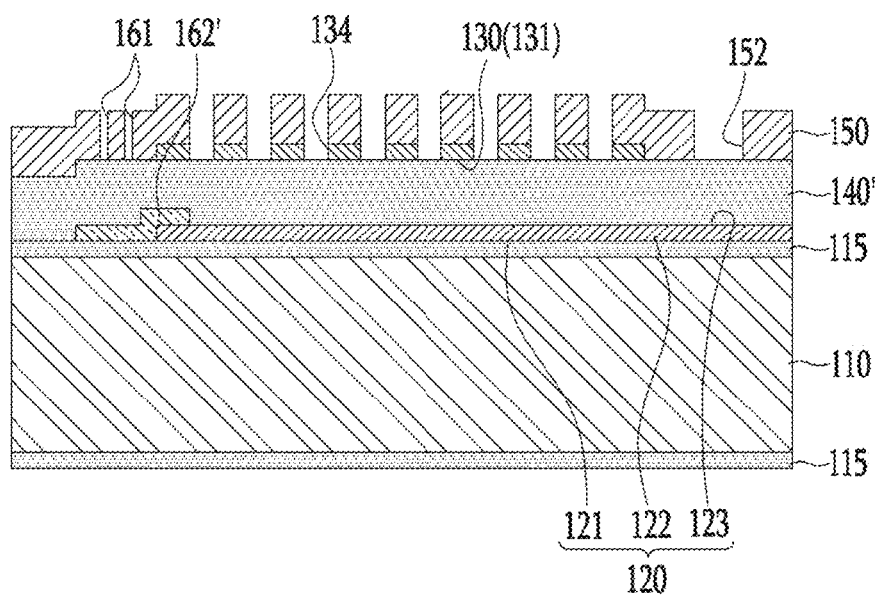

Referring to FIG. 10, the back plate 150 and the underlying fixed membrane 130 are etched to form a plurality of air inlets 134 perforated in the same pattern.

Here, the plurality of air inlets 1334 may be formed by performing dry etching or wet etching, and here, the dry etching or wet etching is performed until the sacrificial layer 140' is exposed.

Also, a plurality of thin, long slots 161 vertically penetrating through the non-sensing area of the back plate 150 are formed on outside of the edge of the sensing area of the fixed membrane 130.

A first contact hole 151 opening the first pad 133 of the fixed membrane 130 and a second contact hole 152 opening the second pad 123 of the vibration membrane 120 are formed on the back plate 150.

Here, the plurality of air inlets 134, the plurality of slots 161, and the plurality of contact holes 151 and 152 may be simultaneously formed through the same process in the MEMS manufacturing process.

Figure 11:
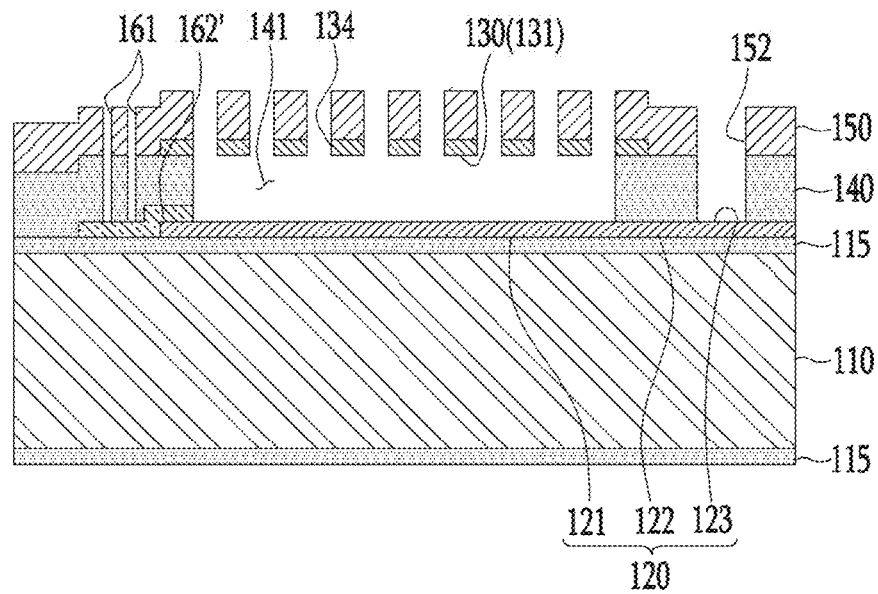

Referring to FIG. 11, a central portion of the sacrificial layer 140' is removed through the air inlets 134 to form an air layer 141 between the vibration membrane 120 and the fixed membrane 130.

Here, after the air layer 141 is formed by removing the central portion of the sacrificial layer 140', a support layer 140 supporting the edge portion of the fixed membrane 130 is formed.

The air layer 141 may be formed by removing the sacrificial layer 140' through a wet etching method using an etchant through the air inlets 134. Also, the sacrificial layer 140' may be removed through a dry etching method by performing ashing based on oxygen ($O_2$) plasma through the air inlets 134.

Also, a portion of the sacrificial layer 140' is removed through the plurality of slots 161 to expose the PR layer 162'.

Also, a portion of the sacrificial layer 140' is removed through the first contact hole 151 and the second contact hole 152 to expose the first pad 133 and the second pad 123.

Here, the sacrificial layer 140' of the portions where the plurality of slots 161 and the contact holes 151 and 152 extend may be simultaneously removed through a wet or dry etching method.

Figure 12:
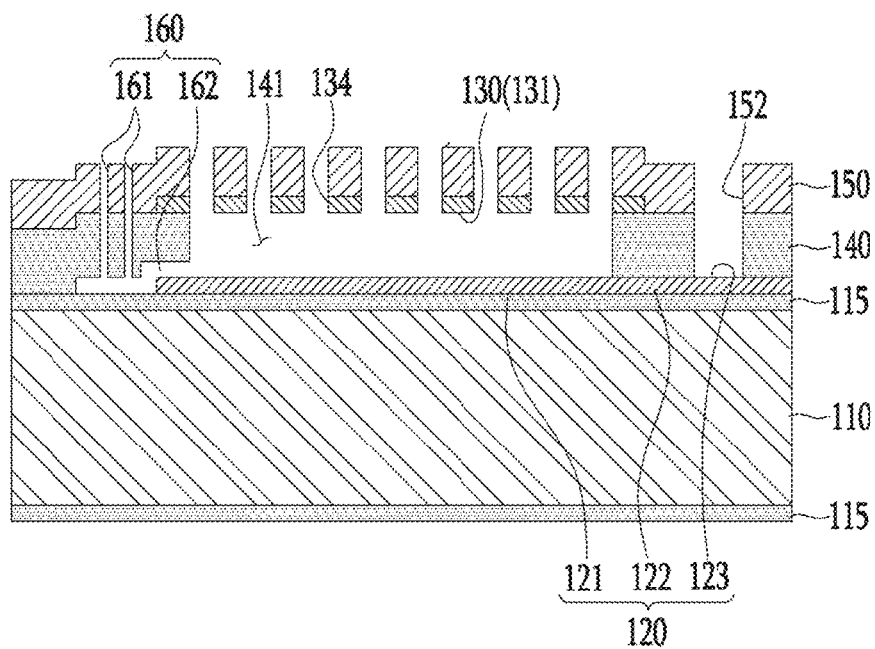

Referring to FIG. 12, the PR layer 162' is removed through the plurality of slots 161 to form a connection passage 162 connected to the air layer 141.

Here, as the connection passage 162 is formed, an air outflow part 160 allowing air of the air layer 141 to flows out from the edge of the sensing area of the fixed membrane 130 through the plurality of slots 161 is configured.

The air outflow part 160 serves to reduce an influence due to air damping when the vibration membrane 120 is vibrated according to an external sound source to enhance sensitivity of the microphone 100.

Figure 13:
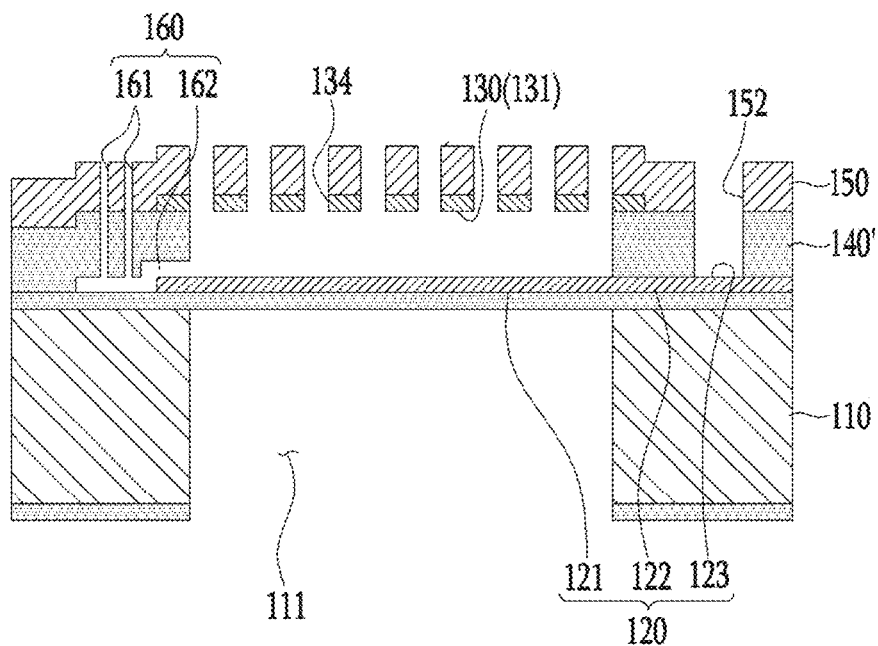

Referring to FIG. 13, a through portion 111 to allow a sound source to input is formed by etching a rear side of the central portion of the substrate 110.

Thereafter, the oxide film 115 present on a lower surface of the substrate 110 and within the through portion 111 is removed to form the microphone 110 structure of the present invention.

In this manner, according to an embodiment of the present invention, since the thin, long slots reducing an air damping effect between the vibration membrane and the fixed membrane are formed on the outer area of the edge of the sensing area of the fixed membrane to allow air of the air layer to flow out, whereby sensitivity may be increased by reducing the air damping effect without reducing the sensing area.

Also, application of the microphone 100 to a directional microphone package allows air flow but prevents an introduction of a sound source through the thin, long holes of the slots, whereby sensitivity, together with directional characteristics, may be increased.

So far, embodiments of the present invention have been described, but the scope of the present invention is not limited thereto and may be variously modified.

For example, in the method for manufacturing a microphone described above with reference to FIGS. 7 to 13, it is described that the connection passage 162 is formed by removing the PR layer 162' through the plurality of slots 161 in FIG. 12, but the present invention is not limited thereto and the following embodiment may also be applied.

[Method for Manufacturing Microphone According to Another Embodiment]

Figure 14:
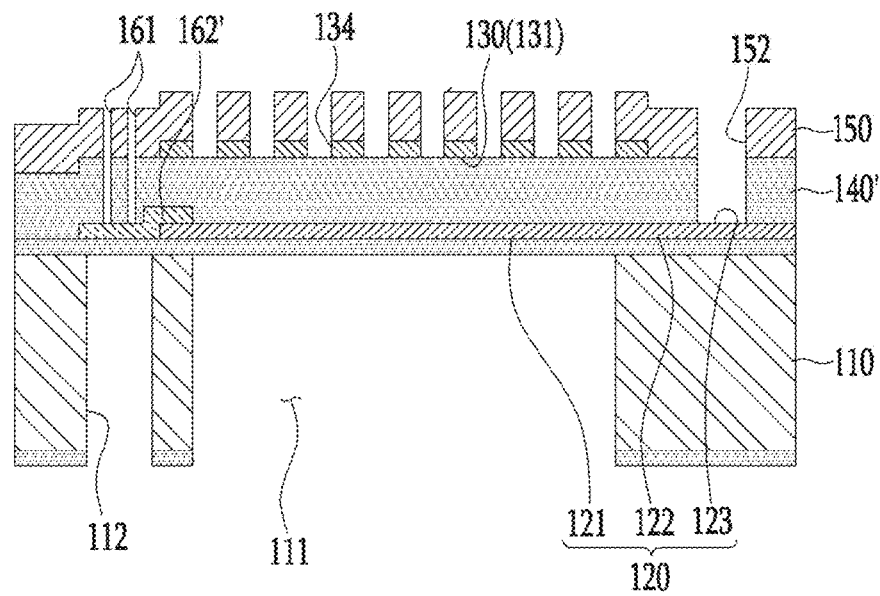
FIGS. 14 and 15 are views illustrating a method for manufacturing a microphone according to another embodiment of the present invention.
Figure 15:
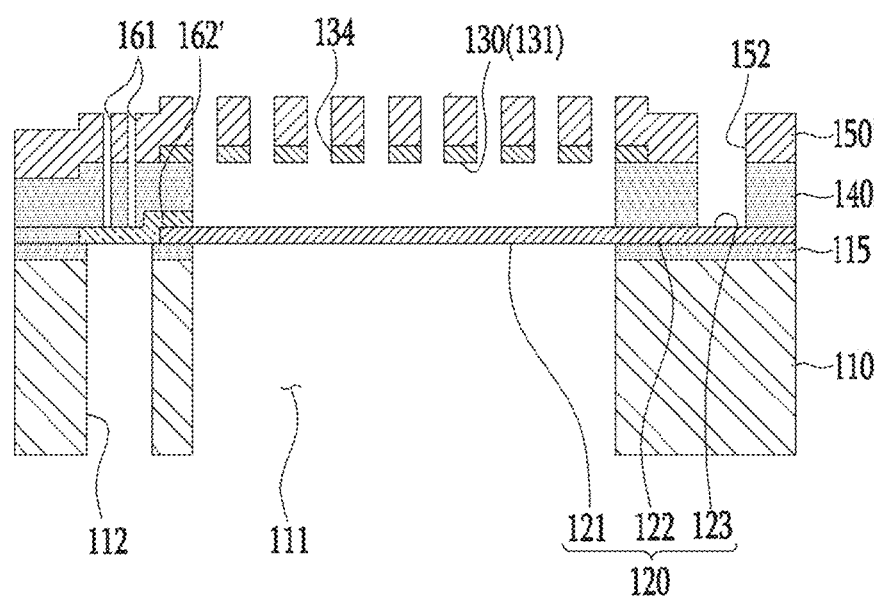

FIGS. 14 and 15 are views illustrating a method for manufacturing a microphone according to another embodiment of the present invention.

Hereinafter, in describing another embodiment of the present invention, the same parts as those of the manufacturing method described above will be omitted and different parts will be largely described.

Referring to FIG. 14, in order to easily remove the PR layer 162', compared with the previous embodiment in terms of the characteristics that the plurality of slots 161 are formed as thin, long holes, a second through portion 112 may be formed to open the PR layer 162' by etching the rear side of the substrate 110.

Here, the second through portion 112 may be simultaneously formed during the process of forming the through portion 111 for a sound source input by etching the rear side of the central portion of the substrate 110.

Referring to FIG. 15, the oxide film 115 on a lower surface of the substrate 110 and within the first through portion 111 and the second through portion 112 is removed.

Here, the PR layer 162' is exposed through the second through portion 112 having a diameter larger than that of the slots 161.

Thus, the connection passage 162 may be formed by easily removing the PR layer 162' through the second through portion 112, rather than the slots 161.

Figure 16:
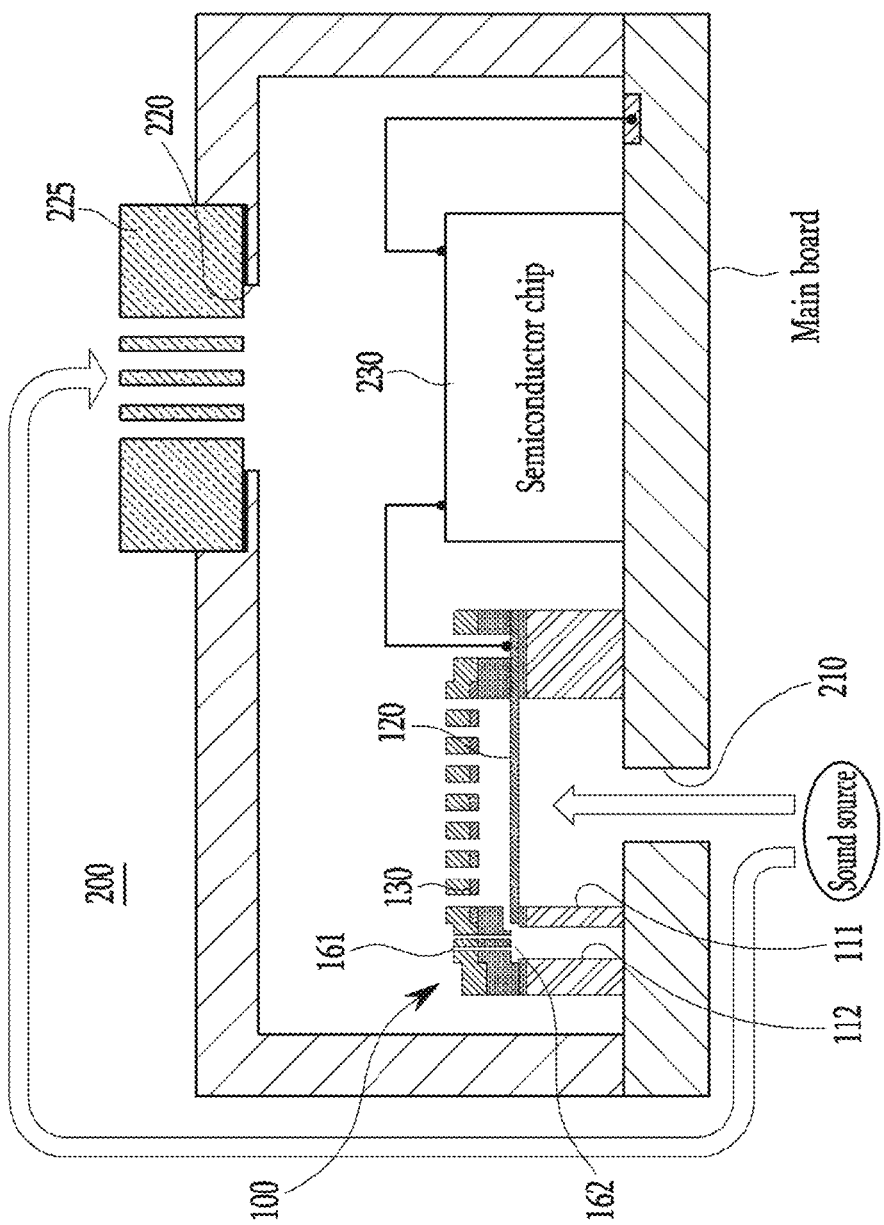
FIG. 16 is a view schematically illustrating a mounting structure of a directional package of a microphone according to another embodiment of the present invention.

FIG. 16 is a view schematically illustrating a mounting structure of a directional package of a microphone according to another embodiment of the present invention.

Referring to FIG. 16, when the microphone 100 according to another embodiment of the present invention is mounted within a directional package, the second through portion 112 is blocked by a main board, and thus, an external sound source is not allowed to be input.

Thus, the connection passage 162 may be easily formed through the second through portion 112, whereby the same increase in the sensing and directional characteristics as those of the previous embodiment described above may be obtained.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 100: microphone | 110: substrate |
| 111: through portion | 120: vibration membrane |
| 130: fixed membrane | 140: sacrificial layer |
| 141: air layer | 150: rear plate |
| 160: air flow part | 161: slot |
| 162: connection passage | |

What is claimed is:

1. A microphone comprising:
a substrate with a through portion formed in a central portion thereof;
a vibration membrane disposed on the substrate and covering the through portion;
a fixed membrane installed above the vibration membrane and spaced apart from the vibration membrane with an air layer interposed therebetween, and including a plurality of air inlets perforated in a direction toward the air layer;
a support layer supporting the fixed membrane installed above the vibration membrane and spaced apart from the vibration membrane;
a back plate formed on the fixed membrane and the support layer and having the air inlet formed to extend in a central portion thereof; and
an air outflow part allowing air of the air layer to flow to an outer area of an edge of a sensing area of the fixed membrane on the back plate,
wherein the air outflow part comprises:
a plurality of slots vertically penetrating through the outer area of the edge of sensing area of the fixed membrane of the back plate with respect to the fixed membrane, and
a correction passage connecting the plurality of slots and the air layer.

2. The microphone of claim 1, wherein:
the plurality of slots are formed as thin and long holes, relative to the air inlet, to allow only a flow of air and prevent an introduction of a sound source.

3. The microphone of claim 1, wherein:
the plurality of slots are disposed in a circular shape along the outer area of the edge of the sensing area of the fixed membrane, centered on the fixed membrane.

4. The microphone of claim 1, wherein:
the connection passage is formed by forming a photoresist (PR) layer on portions of upper surfaces of the vibration membrane, forming the plurality of slots on the PR layer, and subsequently removing the PR layer.

5. The microphone of claim 1, further comprising:
a directional package in which a first sound source inflow hole is formed below a substrate where the through portion is formed and a second sound source inflow hole is formed above the substrate and a sound source is introduced through the first sound source inflow hole and the second source inflow hole.

6. The microphone of claim 5, wherein:
the vibration membrane includes a vibration electrode exposed by the through hole and vibrated by a sound source, a conducting wire connected to the vibration electrode, and a pad electrically connected to a semiconductor chip when mounted in a directional package.

7. The microphone of claim 6, wherein:
the vibration electrode, the conducing wire, and the pad of the vibration membrane are formed at a time by patterning a conductive material.

8. The microphone of claim 1, wherein:
an oxide film is disposed between the substrate and the vibration membrane and a central portion of the oxide film is open to allow the through portion to extend inwardly.

9. A method for manufacturing a microphone, the method comprising:
a) forming an oxide film and a vibration membrane on a substrate and forming a photoresist (PR) layer on portions of upper surfaces of the vibration membrane and the oxide film;
b) forming a sacrificial layer on the oxide film with the vibration membrane and the PR layer formed thereon and forming a fixed membrane and a back plate on the sacrificial layer;
c) etching the back plate and the underlying fixed membrane in the same pattern to form a plurality of air inlets and forming a plurality of slots vertically penetrating a non-sensing area outside of an edge of a sensing area of the fixed membrane;
d) removing a central portion of the sacrificial layer through the plurality of air inlets to form an air layer and removing a portion of the sacrificial layer through the plurality of slots to expose the PR layer;
e) removing the PR layer through the plurality of slots to form an air outflow part allowing air of the air layer to flow out from the edge of the sensing area of the fixed membrane through the plurality of slots; and
f) forming a through portion allowing a sound source input by etching a rear side of the central portion of the substrate.

10. The method of claim 9, wherein:
operation e) comprises:
removing the PR layer to form a connection passage connecting the plurality of slots and the air layer.

11. The method of claim 9, wherein:
in operation d),
a central portion of the sacrificial layer is removed to form a support layer supporting an edge portion of the fixed membrane.

12. The method of claim 9, wherein:
operation c) comprises:
forming a first contact hole opening a first pad of the fixed membrane and a second contact hole opening a second pad of the vibration membrane on the back plate.

13. The method of claim 12, wherein:
operation d) comprises:
removing a portion of the sacrificial layer through the first contact hole and the second contact hole to expose the first pad and the second pad.

14. The method of claim 12, wherein:

in operation c), the plurality of air inlets, the plurality of slots, and the first and second contact holes are simultaneously formed through the same etching process.

15. The method of claim 12, wherein:

in operation d), the sacrificial layer of the portions where the plurality of slots and the first and second contact holes extend are simultaneously removed through a wet or dry etching method.

16. A method for manufacturing a microphone, the method comprising:

a) forming an oxide film and a vibration membrane on a substrate and forming a photoresist (PR) layer on portions of upper surfaces of the vibration membrane and the oxide film;

b) forming a sacrificial layer on the oxide film with the vibration membrane and the PR layer formed thereon and forming a fixed membrane and a back plate on the sacrificial layer;

c) etching the back plate and the underlying fixed membrane in the same pattern to form a plurality of air inlets and forming a plurality of slots vertically penetrating a non-sensing area outside of an edge of a sensing area of the fixed membrane;

d) removing a central portion of the sacrificial layer through the plurality of air inlets to form an air layer and removing a portion of the sacrificial layer through the plurality of slots to expose the PR layer;

e) forming a first through portion for a sound source input to a central portion and a second through portion opening the PR layer by etching a rear side of the substrate; and f) removing the PR layer through the second through portion to form an air outflow part allowing air of the air layer to flow out from the edge of the sensing area of the fixed membrane through the plurality of slots.

17. The method of claim 16, further comprising:

after operation f), g) mounting in a directional package in which a first sound source inflow hole is formed in a lower main board and a second sound source inflow hole is formed in an upper case to allow a sound source to be introduced, wherein the first through portion is positioned above the first sound source inflow hole and the second through portion is blocked by the main board.

* * * * *